US011011406B2

(12) United States Patent
Priewasser et al.

(10) Patent No.: US 11,011,406 B2
(45) Date of Patent: May 18, 2021

(54) METHOD OF PROCESSING A SUBSTRATE

(71) Applicant: DISCO Corporation, Tokyo (JP)

(72) Inventors: Karl Heinz Priewasser, Munich (DE);
Kensuke Nagaoka, Munich (DE)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/543,058

(22) Filed: Aug. 16, 2019

(65) Prior Publication Data

US 2020/0066569 A1 Feb. 27, 2020

(30) Foreign Application Priority Data

Aug. 24, 2018 (DE) .................. 10 2018 214 337.4

(51) Int. Cl.
*H01L 21/68* (2006.01)
*H01L 21/683* (2006.01)
*H01L 21/304* (2006.01)
*H01L 21/78* (2006.01)

(52) U.S. Cl.
CPC ........ *H01L 21/6836* (2013.01); *H01L 21/304* (2013.01); *H01L 21/78* (2013.01); *H01L 2221/6834* (2013.01); *H01L 2221/68327* (2013.01)

(58) Field of Classification Search
CPC ... H01L 21/6836; H01L 21/304; H01L 21/78; H01L 2221/6834; H01L 2221/68327
See application file for complete search history.

(56) References Cited

U.S. PATENT DOCUMENTS

2008/0099912 A1* 5/2008 Wu .................. H01L 24/05 257/737
2016/0079303 A1* 3/2016 Takyu ............... H01L 27/1464 438/59

FOREIGN PATENT DOCUMENTS

| CN | 1318206 A | 10/2001 |
|---|---|---|
| EP | 2631938 A1 | 8/2013 |
| JP | 2004217757 A | 8/2004 |
| JP | 2006100413 A | 4/2006 |
| JP | 2007165636 A | 6/2007 |
| JP | 2008078430 A | 4/2008 |
| JP | 2016018901 A | 2/2016 |
| JP | 2016096325 A | 5/2016 |
| WO | 2017036512 A1 | 3/2017 |
| WO | 2018002035 A2 | 1/2018 |

* cited by examiner

*Primary Examiner* — Matthew L Reames
(74) *Attorney, Agent, or Firm* — Greer Burns & Crain Ltd.

(57) ABSTRACT

The invention relates to a method of processing a substrate. The substrate has one side and a side opposite to the one side. The substrate has, on the one side or on the side opposite to the one side, at least one recess. The method comprises providing a protective film and applying the protective film to the side of the substrate having the at least one recess so that at least a central area of a front surface of the protective film is in direct contact with the side of the substrate having the at least one recess. The method further comprises applying pressure to the protective film so that the protective film enters into the at least one recess along at least part of a depth of the recess, and processing the one side of the substrate and/or the side of the substrate opposite to the one side.

26 Claims, 5 Drawing Sheets

METHOD OF PROCESSING A SUBSTRATE

TECHNICAL FIELD

The present invention relates to a method of processing a substrate, such as a wafer, e.g., a semiconductor wafer, having at least one recess on one of its sides.

TECHNICAL BACKGROUND

When processing a substrate, such as for example a semiconductor wafer, it is important to protect the sides of the substrate from damage and contamination. This requirement is particularly pronounced if devices, e.g., semiconductor devices, are formed on a side of the substrate.

For example, in a semiconductor device fabrication process, a wafer, as a substrate, having a device area with a plurality of devices, commonly partitioned by a plurality of division lines, is processed so as to be divided into individual dies. This fabrication process generally comprises a grinding step for adjusting the wafer thickness and a cutting step of cutting the wafer along the division lines to obtain the individual dies. The grinding step is performed from a back side of the wafer which is opposite to a wafer front side on which the device area is formed. Moreover, also other processing steps, such as polishing and/or etching, may be carried out on the back side of the wafer. The wafer may be cut along the division lines from its front side or its back side.

Protection to a substrate side may be provided by attaching thereto a protective film or sheeting. In particular, in order to protect devices formed on a wafer, e.g., from breakage, deformation and/or contamination by debris, grinding water or cutting water, during processing of the wafer, such a protective film or sheeting may be applied to the front side of the wafer prior to processing.

Such protection of a side of the substrate is particularly important if a recess, such as a trench, a groove, a cut or the like, is present on the side. For one thing, such recesses are prone to contamination, for example, by debris or water, which may accumulate therein. For another thing, the presence of the recess may result in an inhomogeneous distribution of pressure during processing, such as grinding, polishing or cutting, thus increasing the risk of mechanical damage to the substrate, e.g., substrate breakage.

Therefore, the use of a protective film or sheeting is of particular importance when processing substrates with one or more recesses on a side thereof.

However, the side of the substrate to which the protective film or sheeting is attached may be damaged by the adhesive force of an adhesive layer formed on the protective film or sheeting or may be contaminated by adhesive residues when the film or sheeting is peeled off from the substrate. In particular, such residues may remain in a recess formed on the substrate side. This issue is particularly problematic if sensitive devices, such as for example MEMS, are formed on the side of the substrate to which the protective film or sheeting is applied. In this case, the device structure may be severely compromised.

Hence, there remains a need for a reliable and efficient method of processing a substrate having a recess on one of its sides which allows for any risk of contamination and damage to the substrate to be minimised.

SUMMARY OF THE INVENTION

Accordingly, it is an object of the present invention to provide a reliable and efficient method of processing a substrate having a recess on one of its sides which allows for any risk of contamination and damage to the substrate to be minimised. This goal is achieved by a substrate processing method with the technical features of claim 1. Preferred embodiments of the invention follow from the dependent claims.

The invention provides a method of processing a substrate. The substrate has one side, e.g., a front side, and a side being opposite to the one side, e.g., a back side. The substrate has, on the one side or on the side being opposite to the one side, at least one recess. The method comprises providing a protective film or sheet and applying the protective film or sheet to the side of the substrate having the at least one recess so that at least a central area of a front surface of the protective film or sheet is in direct contact with the side of the substrate having the at least one recess. Further, the method comprises applying pressure to the protective film or sheet so that the protective film or sheet enters into the at least one recess along at least part of a depth of the recess, and processing the one side of the substrate and/or the side of the substrate being opposite to the one side.

The protective film is applied to the side of the substrate having the at least one recess so that at least the central area of the front surface of the protective film or sheet is in direct contact with the side of the substrate having the at least one recess. Thus, no material, in particular, no adhesive, is present between at least the central area of the front surface of the protective film and the side of the substrate having the at least one recess.

Therefore, the risk of a possible contamination of or damage to the substrate, e.g., due to an adhesive force of an adhesive layer or adhesive residues on the substrate, can be significantly reduced or even eliminated.

During and/or after applying the protective film to the side of the substrate having the at least one recess, pressure is applied to the protective film so that the protective film enters into the at least one recess along at least part of a depth of the recess. In this way, the protective film can be attached to the side of the substrate having the at least one recess. An attachment force between protective film and substrate, holding the protective film in its position on the substrate, can be generated through the application of pressure. Hence, no additional adhesive material is necessary for attaching the protective film to the side of the substrate having the at least one recess.

In particular, by applying pressure to the protective a form fit, such as a positive fit, and/or a material bond, such as an adhesive bond, may be formed between the protective film and the substrate. The terms "material bond" and "adhesive bond" define an attachment or connection between protective film and substrate due to atomic and/or molecular forces acting between these two components.

The term "adhesive bond" relates to the presence of these atomic and/or molecular forces, which act so as to attach or adhere the protective film to the substrate, and does not imply the presence of an additional adhesive between protective film and substrate. Rather, at least the central area of the front surface of the protective film is in direct contact with the side of the substrate having the at least one recess, as has been detailed above.

The substrate has, on the one side or on the side being opposite to the one side, at least one recess. The substrate may have, on the one side or on the side being opposite to the one side, a plurality of recesses. The at least one recess may be, for example, a trench, a groove or a cut, such as a partial cut extending along part of the thickness of the substrate. The at least one recess may extend inwards from a plane surface of the substrate, i.e., in a direction from the surface towards the bulk of the substrate.

The pressure is applied to the protective film so that the protective film enters into the at least one recess along at least part of a depth of the recess. Hence, the at least one recess is particularly reliably sealed and, thus, safely protected from contamination. Further, at least part of the side walls of the at least one recess is protected by the protective film.

The method of the present invention thus enables reliable and efficient processing of a substrate having a recess on one of its sides, minimising any risk of contamination and damage to the substrate.

The protective film may be applied to the side of the substrate having the at least one recess so that the front surface of the protective film is in direct contact with the side of the substrate having the at least one recess in the entire region where the at least one recess is present. In this way, any contamination of the recess, in particular, due to adhesive residues, can be especially reliably avoided.

The pressure may be applied to the protective film before processing the one side of the substrate and/or the side of the substrate being opposite to the one side.

The pressure may be applied to the protective film by a pressure application means, such as a roller, a roller mount, a pressing plate, a stamp, a membrane or the like.

Applying the pressure to the protective film may comprise or consist of applying a vacuum to the protective film during and/or after applying the protective film to the side of the substrate having the at least one recess. A vacuum may be applied to the protective film so that the protective film enters into the at least one recess along at least part of the depth of the recess. In this way, it can be particularly reliably ensured that the protective film enters into the at least one recess along at least part of the depth of the recess.

The pressure may be applied to the protective film in a vacuum chamber, as will be further detailed below.

The protective film may be applied and/or attached to the side of the substrate having the at least one recess in a reduced pressure atmosphere, in particular, under a vacuum. In this way, it can be especially reliably ensured that the protective film enters into the at least one recess along at least part of the depth of the recess and that no voids and/or air bubbles are present between the protective film and the substrate. Hence, any stress or strain on the substrate during processing the one side of the substrate and/or the side of the substrate being opposite to the one side, e.g., due to such air bubbles expanding, for example, in a heating process, is avoided.

For example, the step or steps of applying and/or attaching the protective film to the side of the substrate having the at least one recess may be carried out in a vacuum chamber. In particular, the protective film may be applied and/or attached to the side of the substrate having the at least one recess by using a vacuum laminator. In such a vacuum laminator, the substrate is placed on a chuck table in a vacuum chamber in a state in which the side of the substrate which does not have the at least one recess is in contact with an upper surface of the chuck table and the side of the substrate having the at least one recess is oriented upward. The chuck table may be, for example, a heated chuck table.

The protective film to be applied to the side of the substrate having the at least one recess is held at its peripheral portion by an annular frame and placed above this substrate side in the vacuum chamber. An upper part of the vacuum chamber which is situated above the chuck table and the annular frame is provided with an air inlet port closed by an expandable rubber membrane.

After the substrate and the protective film have been loaded into the vacuum chamber, the chamber is evacuated and air is supplied through the air inlet port to the rubber membrane, causing the rubber membrane to expand into the evacuated chamber. In this way, the rubber membrane is moved downward in the vacuum chamber so as to push the protective against the side of the substrate having the at least one recess, sealing the peripheral substrate portion with the protective film and pressing the film against the side of the substrate having the at least one recess. Hence, it can be reliably ensured that the protective film enters into the at least one recess along at least part of the depth of the recess.

The protective film may be heated during and/or after application thereof to the side of the substrate having the at least one recess, e.g., by heating the chuck table.

Subsequently, the vacuum in the vacuum chamber is released and the protective film is held in its position on the side of the substrate having the at least one recess by the attachment force generated through the positive pressure in the vacuum chamber and, optionally, through a heating process. Such a heating process will be described in further detail below.

Alternatively, the rubber membrane can be replaced by a soft stamp or a soft roller, e.g., a heated soft stamp or a heated soft roller.

The substrate may be a wafer. The substrate may be, for example, a semiconductor wafer, a glass wafer, a sapphire wafer, a ceramic wafer, such as an alumina ($Al_2O_3$) ceramic wafer, a quartz wafer, a zirconia wafer, a PZT (lead zirconate titanate) wafer, a polycarbonate wafer, a metal (e.g., copper, iron, stainless steel, aluminium or the like) or metalised material wafer, a ferrite wafer, an optical crystal material wafer, a resin, e.g., epoxy resin, coated or molded wafer or the like.

In particular, the substrate may be, for example, a Si wafer, a GaAs wafer, a GaN wafer, a GaP wafer, an InAs wafer, an InP wafer, a SiC wafer, a SiN wafer, a LT (lithium tantalate) wafer, a LN (lithium niobate) wafer or the like.

The substrate may be made of a single material or of a combination of different materials, e.g., two or more of the above-identified materials. For example, the substrate may be a Si and glass bonded substrate, e.g., a Si and glass bonded wafer, in which a substrate element made of Si is bonded to a substrate element made of glass.

The substrate may be a semiconductor-sized wafer. Herein, the term "semiconductor-sized wafer" refers to a wafer with the dimensions (standardised dimensions), in particular, the diameter (standardised diameter), i.e., outer diameter, of a semiconductor wafer. The dimensions, in particular, the diameters, i.e., outer diameters, of semiconductor wafers are defined in the SEMI standards. For example, the semiconductor-sized wafer may be a Si wafer. The dimensions of polished single crystal Si wafers are defined in the SEMI standards M1 and M76. The semiconductor-sized wafer may be a 3 inch, 4 inch, 5 inch, 6 inch, 8 inch, 12 inch or 18 inch wafer.

The substrate may have any type of shape. In a top view thereon, the substrate may have, for example, a circular shape, an oval shape, an elliptical shape or a polygonal shape, such as a rectangular shape or a square shape.

The protective film may have any type of shape. In a top views thereon, the protective film may have, for example, a circular shape, an oval shape, an elliptical shape or a polygonal shape, such as a rectangular shape or a square shape.

The protective film may have substantially the same shape or the same shape as the substrate.

The protective film may have an outer diameter which is larger than an outer diameter of the substrate. In this way, processing, handling and/or transport of the substrate can be facilitated. In particular, an outer peripheral portion of the protective film can be attached to an annular frame, as will be detailed below.

The protective film may have an outer diameter which is smaller than the outer diameter of the substrate.

The protective film may have an outer diameter which is substantially the same as the outer diameter of the substrate.

The substrate may have, on the one side, a device area with a plurality of devices. In particular, the substrate may be a wafer having on the one side a device area with a plurality of devices.

The at least one recess may be present on the one side of the substrate. The method of the invention allows for the devices formed in the device area to be protected from damage and contamination in an of and reliable manner.

The substrate may further have, on the one side thereof, a peripheral marginal area having no devices and being formed around the device area.

At least one division line may be formed on the one side of the substrate. The at least one recess may extend along the at least one division line. A plurality of division lines may be formed on the one side of the substrate. A plurality of recesses may be present on the one side of the substrate. Each of the plurality of recesses may extend along a respective one of the plurality of division lines. The one or more division lines may partition devices which may be formed on the one side of the substrate. The method of the invention allows for the devices, in particular, the front and side surfaces of the devices, to be protected from damage and contamination in an efficient and reliable manner.

The width of the at least one division line may be in the range of 30 μm to 200 μm, preferably 30 μm to 150 μm and more preferably 30 μm to 100 μm.

The method of the invention may further comprise heating the protective film during and/or after applying the protective film to the side of the substrate having the at least one recess. In particular, the method may comprise heating the protective film and applying a vacuum to the protective film. In this case, the vacuum may be applied to the protective film during and/or before and/or after heating the protective film.

The method may further comprise allowing the protective film to cool down after the heating process. In particular, the protective film may be allowed to cool down to its initial temperature, i.e., to the temperature thereof prior to the heating process. The protective film may be allowed to cool down, e.g., to its initial temperature, before processing the one side of the substrate, e.g., the substrate front side, and/or the side of the substrate being opposite to the one side, e.g., the substrate back side.

An attachment force between protective film and substrate may be generated through the heating process. The attachment of the protective film to the substrate may be caused in the heating process itself and/or in a subsequent process of allowing the protective film to cool down.

The protective film may be softened by the heating process. Upon cooling down, e.g., to its initial temperature, the protective film may reharden, e.g., so as to create a form fit and/or a material bond to the substrate.

By softening the protective film through a heating process, it can be particularly reliably ensured that the protective film enters into the at least one recess along at least part of the depth of the recess.

The protective film may be heat resistant up to a temperature of 180° C. or more, preferably up to a temperature of 220° C. or more, more preferably up to a temperature of 250° C. or more, and even more preferably up to a temperature of 300° C. or more.

The protective film may be heated to a temperature in the range of 30° C. to 250° C., preferably 50° C. to 200° C., more preferably) 60° C. to 150° C., and even more preferably 70° C. to 110° C. Particularly preferably, the protective film is heated to a temperature of approximately 80° C.

The protective film may be heated over a duration in the range of 30 sec to 10 min, preferably 1 min. to 8 min, more preferably 1 min to 6 min, even more preferably 1 min to 4 min and yet more preferably 1 min to 3 min, during and/or after applying the protective film to the side of the substrate having the at least one recess.

The protective film may be directly and/or indirectly heated.

The protective film may be heated by directly applying heat thereto, e.g., using a heat application means, such as a heated roller, a heated stamp or the like, or a heat radiation means. The protective film and the substrate may be placed in a receptacle or chamber, such as a vacuum chamber, and an inner volume of the receptacle or chamber may be heated, so as to heat the protective film. The receptacle or chamber may be provided with a heat radiation means.

The protective film may be indirectly heated, e.g., by heating the substrate before and/or during and/or after applying the protective film to the side of the substrate having the at least one recess. For example, the substrate may be heated by placing the substrate on a support or carrier, such as a chuck table, and heating the support or carrier.

For example, the support or carrier, such as a chuck table, may be heated to a temperature in the range of 30° C. to 250° C., preferably 50° C. to 200° C., more preferably 60° C. to 150° C. and even more preferably 70° C. to 110° C. Particularly preferably, the support or carrier may be heated to a temperature of approximately 80° C.

These approaches may also be combined, for example, by using a heat application means, such as a heated roller or the like, or a heat radiation means for directly heating the protective film, and also indirectly heating the protective film through the substrate.

It is preferable that the protective film pliable, elastic, flexible, stretchable, soft and/or compressible. The protective film may be pliable, elastic, flexible, stretchable, soft and/or compressible at room temperature, e.g., in the temperature range of 18 to 23° C., and/or when in its heated state. Particularly preferably, the protective film is pliable, elastic, flexible, stretchable, soft and/or compressible at room temperature, and the pliability, elasticity, flexibility, stretchability, softness and/or compressibility of the protective film is further enhanced when it is in its heated state.

In this way, it can be particularly reliably ensured that the protective film enters into the at least one recess along at least part of the depth of the recess.

Preferably, the protective film, at least to some degree, hardens or stiffens upon cooling down, so as to become more rigid and/or robust in the cooled down state. In this way, particularly reliable protection of the substrate during subsequent processing of the substrate, such as grinding and/or cutting the substrate, can be ensured.

The pressure may be applied to the protective film before and/or during and/or after heating the protective film.

Particularly preferably, a combined heat and pressure application means, such as a heated roller, a heated pressing plate or a heated stamp, may be used. In this case, pressure can be applied to the protective film while, at the same time, heating the protective film.

The pressure may be applied to the protective film so that the protective film enters into the at least one recess to a depth of 3 to 500 µm, preferably 5 to 300 µm, in particular, 5 to 50 µm.

The at least one recess may have a depth, i.e., an extension along the thickness direction of the substrate, in the range of 5 to 1500 µm or in the range of 50 to 1000 µm or in the range of 100 to 800 µm. The at least one recess may have a depth in the range of 2% to 90% or in the range of 5% to 70% or in the range of 8% to 50% or in the range of 10% to 40% or in the range of 12% to 30% of the substrate thickness.

The pressure may be applied to the protective film so that the protective film enters into the at least one recess to a depth of 2% to 100%, preferably 5% to 90%, more preferably 10% to 80%, even more preferably 15% to 70% and yet more preferably 20% to 60% of the depth of the at least one recess.

The method of the invention may further comprise removing substrate material on the one side of the substrate or on the side of the substrate being opposite to the one side so as to form the at least one recess.

For example, removing substrate material may be performed by mechanical cutting, e.g., by blade dicing or sawing, and/or by laser cutting and/or by plasma cutting and/or by etching, e.g., wet etching or dry etching, and/or lithography, such as optical lithography or electron beam lithography. The substrate material may be removed in a single mechanical cutting step, a single laser cutting step, a single plasma cutting step, a single etching step or a single lithography step. Alternatively, the substrate material may be removed by a sequence of two or more of the steps specified above.

Laser cutting may be performed, for example, by ablation laser cutting and/or by stealth laser cutting, i.e., by forming modified areas within the substrate by the application of a laser beam, and/or by forming a plurality of hole regions in the substrate by the application of a laser beam. Each of these hole regions may be composed of a modified region and a space in the modified region open to a surface of the substrate.

The at least one recess may be formed by removing substrate material along at least one division line if such an at least one division line is present. If a plurality of division lines is present, a plurality of recesses may be formed by removing substrate material along each of the division lines.

The substrate material may be removed along part of the thickness of the substrate, for example, along 5% or more, 10% or more, 20% or more, 30% or more, 40% or more, 50% or more, 60% or more, 70% or more, 80% or more, or 90% or more of the thickness of the substrate. The substrate material may be removed along 90% or less, 80% or less, 70% or less, 60% or less, 50% or less, 40% or less, 30% or less, 20% or less, 10% or less, or 5% or less of the thickness of the substrate.

The method of the invention may comprise processing the side of the substrate being opposite to the one side. Processing the side of the substrate being opposite to the one side may comprise grinding the side of the substrate being opposite to the one side to adjust the substrate thickness.

The method may further comprise polishing, e.g., dry polishing or chemical mechanical polishing (CMP), and/or etching, e.g., wet etching or dry etching, such as plasma etching, the side of the substrate being opposite to the one side. If the side of the substrate being opposite to the one side is subjected to a grinding step, the steps of polishing and/or etching may be performed after grinding.

The method may further comprise dividing the substrate into a plurality of separate elements. For example, the substrate may be a wafer having on the one side a device area with a plurality of devices. The method may comprise dividing the wafer into a plurality of individual chips or dies. For example, the substrate may be divided into the plurality of separate elements, such as individual chips or dies, in the following ways.

Substrate material may be removed, e.g., along at least one division line, if present, so as to form the at least one recess. The step of removing substrate material may be performed, for example, in the manner detailed above. The substrate material removal process may be performed from the one side of the substrate. The protective film may be applied to the side of the substrate having the at least one recess formed therein. Subsequently, the side of the substrate being opposite to the side having the at least one recess may be ground to adjust the substrate thickness. The substrate material may be removed alone; only a part of the thickness of the substrate. Grinding the side of the substrate being opposite to the side having the at least one recess may be performed along a remaining part of the thickness of the substrate in which no wafer material has been removed, so as to divide the substrate, e.g., along the at least one division line.

Alternatively, the substrate may be fully divided into the plurality of separate elements, such as individual chips or dies, by cutting the substrate, e.g., along at least one division line, if present. The substrate may be cut from the side of the substrate being opposite to the side having the at least one recess. The cutting process may be performed before or after grinding the side of the substrate being opposite to the side having the at least one recess.

The cutting step may be carried out, for example, in the manner detailed above, e.g., by mechanical cutting, e.g., by blade dicing or sawing, and/or by laser cutting and/or by plasma cutting and/or by etching, e.g., wet etching or dry etching.

Laser cutting may be performed, for example, by ablation laser cutting and/or by stealth laser cutting, i.e., by forming modified areas within the substrate by the application of a laser beam, and/or by forming a plurality of hole regions in the substrate by the application of a laser beam. Each of these hole regions may be composed of a modified region and a space in the modified region open to a surface of the substrate. Following the formation of the modified areas or the hole regions in the substrate, the substrate may be fully divided by applying an external force in the radial directions of the substrate, e.g., by radially expanding an expansion tape. For example, the protective film may be used as such an expansion tape.

Further, the substrate may be divided into the separate elements by scribing the substrate, e.g., using a diamond scriber, a laser scriber or the like, and subsequently breaking the substrate by the application of an external force thereto.

The substrate may be divided into the separate elements by a combination of the processes detailed above. For example, the side of the substrate being opposite to the side having the at least one recess may be mechanically partially cut with a first cutting width, and a remaining part of the substrate, in the thickness direction thereof in the region or regions where the partial cut or cuts had been formed, may be mechanically cut and/or cut by laser and/or cut by plasma from the side of the substrate being opposite to the side having the at least one recess with a second cutting width. The second cutting width may be smaller than or equal to the first cutting width. Subsequently, the side of the substrate being opposite to the side having the at least one recess may be ground, e.g., so as to remove possible damages caused by the mechanical partial cutting step.

The method may further comprise picking up the separate elements, such as the individual chips or dies, from the protective film. This pick up step may be performed using a pick up device.

In the method of the present invention, the protective film is applied to the side of the substrate having the at least one recess so that at least the central area of the front surface of the protective film is in direct contact with the side of the substrate having the at least one recess. Hence, due to the absence of an adhesive layer at least in this central area, the step of picking up the separate elements is greatly facilitated. In particular, the risk of any damage to the separate elements in the pick up step can be considerably reduced or even eliminated. Also, the force required for picking up the separate elements from the protective film is significantly lowered.

Further, in the present method, pressure is applied to the protective film so that the protective film enters into the at least one recess along at least part of the depth of the recess. In this way, the protective film can securely hold the substrate in its position before dividing the substrate and securely hold the separate elements, such as individual chips or dies, in their positions after dividing the substrate. Hence, a movement or shift of the substrate or these separate elements in process steps, such as grinding or picking up the elements, can be reliably prevented. In particular, since no such movement or shift occurs during grinding, an especially accurate and easy alignment can be achieved in possible subsequent cutting, dicing or picking up steps. For example, due to this high degree of alignment accuracy, the substrate can be reliably cut, from the one side or the side being opposite to the one side, by using a thin mechanical cutting means, such as a thin blade or a thin saw.

The protective film may be applied to the side of the substrate having the at least one recess so that, in the entire region where the front surface of the protective film is in contact with the side of the substrate having the at least one recess, the front surface of the protective film is in direct contact with the side of the substrate having the at least one recess. Thus, no material, in particular, no adhesive, is present between the front surface of the protective film and the side of the substrate having the at least one recess.

In this way, the risk of a possible contamination of or damage to the substrate, e.g., due to an adhesive force of an adhesive layer or adhesive residues on the substrate, can be reliably eliminated.

Alternatively, the protective film may be provided with an adhesive layer. In this case, the adhesive layer is provided only in a peripheral area of the front surface of the protective film, the peripheral area surrounding the central area of the front surface of the protective film. The protective film is applied to the side of the substrate having the at least one recess so that the adhesive layer comes into contact only with a peripheral portion of the side of the substrate having the at least one recess. The peripheral portion of the side of the substrate having the at least one recess may be or correspond to a peripheral marginal area formed on the one side of the substrate, e.g., if the substrate is a wafer having on the one side a device area with a plurality of devices.

In this way, the attachment of the protective film to the substrate can be further improved. Since the adhesive layer is provided only in the peripheral area of the front surface of the protective film, the area in which protective film and substrate are attached to each other by the adhesive layer is significantly reduced as compared to a case where an adhesive layer is provided on the entire front surface of the protective film. Thus, the protective film can be detached from the substrate more easily and the risk of damage to the substrate is considerably reduced.

The adhesive of the adhesive layer may be curable by an external stimulus, such as heat, UV radiation, an electric field and/or a chemical agent. In this way, the protective film can be particularly easily removed from the substrate after processing. The external stimulus may be applied to the adhesive so as to lower the adhesive force thereof, thus allowing for an easy removal of the protective film. Also, separate elements, such as individual chips or dies, can be easily picked up from the protective film.

For example, the adhesive layer may have a substantially annular shape, an open rectangular shape or an open square shape, i.e., a rectangular or square shape, respectively, with an opening in the centre of the adhesive layer.

A cushioning layer may be attached to a back surface of the protective film opposite to the front surface thereof.

This approach is particularly advantageous, e.g., if protrusions or projections, such as bumps, optical elements, e.g., optical lenses, other structures or the like, protrude, extend or project from the side of the substrate having the at least one recess along the thickness direction of the substrate.

If the cushioning layer is attached to the back surface of the protective film, such protrusions can be embedded in the cushioning layer. Hence, any negative influence of the protrusions on subsequent substrate processing steps, such as cutting, polishing or grinding, can be eliminated. In particular, the cushioning layer can significantly contribute to achieving a particularly uniform and homogeneous distribution of pressure during such processes.

By embedding the protrusions in the cushioning layer, the protrusions, such as for example optical elements or other structures, are reliably protected from any damage during substrate processing, for example, in subsequent cutting or grinding step.

The material of the cushioning layer is not particularly limited. In particular, the cushioning layer may be formed of any type of material which allows for protrusions protruding along the thickness direction of the substrate to be embedded therein. For example, the cushioning layer may be formed of a resin, an adhesive, a gel or the like.

The cushioning layer may be curable by an external stimulus, such as radiation, heat, an electric field and/or a chemical agent. In this case, the cushioning layer hardens at least to some degree upon application of the external stimulus thereto. For example, the cushioning layer may be formed of a curable resin, a curable adhesive, a curable gel or the like.

The cushioning layer may be configured so as to exhibit a degree of compressibility, elasticity and/or flexibility after curing thereof, i.e., to be compressible, elastic and/or flexible after curing. For example, the cushioning layer may be such that it is brought into a rubber-like state by curing. Alternatively, the cushioning layer may be configured so as to reach a rigid, hard state after curing.

Preferred examples of UV curable resins for use as the cushioning layer in the method of the invention are ResiFlat by the DISCO Corporation and TEMPLOC by DENKA.

The method may further comprise applying the external stimulus to the cushioning layer so as to cure the cushioning layer, for example, before processing, e.g., cutting or grinding, the substrate. In this way, the protection of the substrate during cutting and/or grinding and the cutting and/or grinding accuracies can be further improved.

The cushioning layer may be heat resistant up to a temperature of 180° C., or more, preferably up to a temperature of 220° C. or more, more preferably up to a temperature of 250° C. or more, and even more preferably up to a temperature of 300° C. or more.

The cushioning layer may have a thickness in the range of 10 to 300 μm, preferably 20 to 250 μm and more preferably 50 to 200 μm.

The cushioning layer may be attached to the back surface of the protective film before applying the protective film to the side of the substrate having the at least one recess.

In this case, the protective film and the cushioning layer may be laminated first, forming a protective sheeting comprising the cushioning layer and the protective film attached to the cushioning layer. The protective sheeting formed in this manner may be subsequently applied to the side of the substrate having the at least one recess, e.g., such that protrusions or projections protruding from the plane surface of the wafer are covered by the protective film and embedded in the protective film and the cushioning layer. The protective sheeting may be applied so that the back surface of the cushioning layer is substantially parallel to the side of the substrate being opposite to the side having the at least one recess. The front surface of the protective film is applied to the side of the substrate having the at least one recess when the protective sheeting is applied to the side of the substrate having the at least one recess.

In this way, the substrate processing method can be carried out in a particularly simple and efficient manner. For example, the protective sheeting can be prepared in advance, stored for later use and used for substrate processing when required. The protective sheeting may thus be manufactured in large quantities, rendering the production thereof particularly efficient in terms of both time and cost.

The cushioning layer may be attached to the back surface of the protective film after applying the protective film to the side of the substrate having the at least one recess.

In this case, the protective film is applied to the side of the substrate having the at least one recess first, and the side of the substrate having the at least one recess, having the protective film applied thereto, is subsequently attached to the front surface of the cushioning layer, e.g., so that protrusions or projections protruding from the plane surface of the substrate are embedded in the protective film and the cushioning layer, and the back surface of the cushioning layer is substantially parallel to the side of the substrate being opposite to the side having the at least one recess. This approach allows for the protective film to be attached to the side of the substrate having the at least one recess with a particularly high degree of accuracy, in particular, in relation to protrusions or projections protruding from the plane surface of the wafer.

The cushioning layer may be attached to the back surface of the protective film before and/or during and/or after attaching the protective film to the side of the substrate having the at least one recess.

Pressure may be applied to the cushioning layer so that the cushioning layer enters into the at least one recess along at least part of the depth of the recess.

A base sheet may be attached to the back surface of the cushioning layer opposite to the front surface thereof which is attached to the protective film.

The material of the base sheet is not particularly limited. The base sheet may be made of a soft or pliable material, such as, for example, a polymer material, e.g., polyvinyl chloride (PVC), ethylene vinyl acetate (EVA) or a polyolefin.

Alternatively, the base sheet may be made of a rigid or hard material, such as polyethylene terephthalate (PET) and/or silicon and/or glass and/or stainless steel (SUS).

For example, if the base sheet is made of polyethylene terephthalate (PET) or glass and the cushioning layer is curable by an external stimulus, the cushioning layer may be cured with radiation that is transmittable through polyethylene terephthalate (PET) or glass, for instance UV radiation. If the base sheet is made of silicon or stainless steel (SUS), a cost-efficient base sheet is provided.

Also, the base sheet may be formed of a combination of the materials listed above.

The base sheet may be heat resistant up to a temperature of 180° C. or more, preferably up to a temperature of 220° C. or more, more preferably up to a temperature of 250° C. or more, and even more preferably up to a temperature of 300° C. or more.

The base sheet may have a thickness in the range of 30 to 1500 μm, preferably 40 to 1200 μm and more preferably 50 to 1000 μm.

The cushioning layer and the base sheet may be attached to the back surface of the protective film before or after applying the protective film to the side of the substrate having the at least one recess. In particular, the protective film, the cushioning layer and the base sheet may be laminated first, forming a protective sheeting comprising the base sheet, the cushioning layer and the protective film attached to the cushioning layer. The protective sheeting formed in this manner may be subsequently applied to the side of the substrate having the at least one recess.

The front surface of the base sheet may be in contact with the back surface of the cushioning layer, and a back surface of the base sheet opposite to the front surface thereof may be substantially parallel to the side of the substrate being opposite to the side having the at least one recess. Thus, when processing, e.g., cutting or grinding, the substrate, a suitable counter pressure can be applied to the back surface of the base sheet, e.g., by placing this back surface on a chuck table.

In this case, since the plane back surface of the base sheet is substantially parallel to the side of the substrate being opposite to the side having the at least one recess, pressure applied to the substrate during processing, such as a cutting process, e.g., by a cutting or dicing blade of a cutting apparatus, or a grinding process, is more evenly and homogeneously distributed over the substrate, thus minimising any risk of breakage of the substrate. Further, the substantially parallel alignment of the flat, even back surface of the base sheet and the side of the substrate being opposite to the side having the at least one recess allows for cutting and grinding steps to be carried out with a high degree of precision.

The protective film may be made of a single material, in particular, a single homogeneous material.

The protective film may be made of a plastic material, such as a polymer. Particularly preferably, the protective film is made of a polyolefin. For example, the protective film may be made of polyethylene (PE), polypropylene (PP) or polybutylene (PB).

Polyolefin films have material properties which are especially advantageous for use in the substrate processing method of the present invention, in particular, if the method comprises heating the protective film. Polyolefin films are pliable, stretchable and soft, especially when in a heated state, e.g., when heated to a temperature in the range of 60° C. to 150° C. Thus, it can be particularly reliably ensured that the protective film enters into the at least one recess along at least part of the depth of the recess.

Further, polyolefin films harden and stiffen upon cooling down, so as to become more rigid and robust in the cooled down state. Hence, particularly reliable protection of the substrate during subsequent processing of the wafer can be ensured.

The protective film may have a thickness in the range of 5 to 200 μm, preferably 8 to 100 μm, more preferably 10 to 80 μm and even more preferably 12 to 50 μm. Particularly preferably, the protective film has a thickness in the range of 80 to 150 μm.

In this way, it can be particularly reliably ensured that the protective film is flexible and pliable enough to enter into the at least one recess along at least part of the depth of the recess and, at the same time, exhibits a sufficient thickness in order to reliably and efficiently protect the substrate during processing.

The method may further comprise attaching a peripheral portion of the protective film to an annular frame. In particular, the peripheral portion of the protective film may be attached to the annular frame so that the protective film closes a central opening of the annular frame, i.e., the area inside the inner diameter of the annular frame. In this way, the substrate, which is attached to the protective film, in particular, to a central portion thereof, is held by the annular frame through the protective film. Thus, a substrate unit, comprising the substrate, the protective film and the annular frame, is formed, facilitating processing, handling and/or transport of the substrate.

The step of attaching the peripheral portion of the protective film to the annular frame may be performed before or after applying the protective film to the substrate.

The step of attaching the peripheral portion of the protective film to the annular frame may be performed before or after attaching the protective film to the substrate.

The step of attaching the peripheral portion of the protective film to the annular frame may be performed before or after processing the one side of the substrate and/or the side of the substrate being opposite to the one side.

The annular frame may be a semiconductor-sized annular frame. Herein, the term "semiconductor-sized annular frame" refers to an annular frame with the dimensions (standardised dimensions), in particular, the inner diameter (standardised inner diameter), of an annular frame for holding a semiconductor wafer.

The dimensions, in particular, the inner diameters, of annular frames for holding semiconductor wafers are defined in the SEMI standards. For example, the dimensions of tape frames for 300 mm wafers are defined in SEMI standard SEMI G74 and the dimensions of plastic tape frames for 300 mm wafers are defined in SEMI standard SEMI G87. The annular frames may have frame sizes for holding semiconductor-sized wafers with sizes of, for example, 3 inch, 4 inch, 5 inch, 6 inch, 8 inch, 12 inch or 18 inch.

Attaching the peripheral portion of the protective film to a semiconductor-sized annular frame offers the advantage that conventional semiconductor wafer handling and processing equipment, such as a conventional pick up device, can be used for handling and processing the substrate and the separate elements, such as individual chips or dies.

In the method of the present invention, the protective film may remain attached to the substrate throughout the processing of the substrate. Thus, the same protective film can be used throughout processing of the substrate, e.g., until the separate elements, such as individual chips or dies, obtained by dividing the substrate are picked up from the protective film. In this case, no steps of peeling the protective film from the substrate and remounting the substrate to a different film or tape are required. Hence, the processing method can be greatly simplified. Moreover, due to the reduced number of required substrate handling and processing steps, any risk of damage to the substrate can be further reduced. Also, this approach is particularly efficient, for example, in terms of processing time and costs.

The protective film may be expandable. The protective film may be expanded when being applied to the side of the substrate having the at least one recess. In this way, it can be particularly reliably ensured that the protective film enters into the at least one recess along at least part of the depth of the recess. In particular, the protective film may be expandable to twice its original size or more, preferably three times its original size or more and more preferably four times its original size or more.

If the protective film is expandable it may be used for separating the elements obtained by dividing the substrate, such as chips or dies, from each other. In particular, the method may further comprise, after processing the one side of the substrate and/or the side of the substrate being opposite to the one side, radially expanding the protective film so as to separate the elements from each other.

For example, the substrate may be fully divided, e.g., by a mechanical cutting process, a laser cutting process or a plasma cutting process, or by a dicing before grinding process. Subsequently, the fully divided elements, such as chips or dies, may be moved away from each other by radially expanding the protective film, thereby increasing the distances between adjacent elements.

Alternatively, the substrate may be subjected to a stealth dicing process, i.e., a process in which modified regions are formed within the wafer by the application of a laser beam, as has been detailed above. Subsequently, the substrate may be divided, e.g., broken, for example, along at least one division line, where the modified regions are formed by radially expanding the protective film, thereby obtaining the separate elements.

As an alternative to radially expanding the protective film, a separate expansion tape may be used.

BRIEF DESCRIPTION OF THE DRAWINGS

Hereinafter, non-limiting examples of the invention are explained with reference to the drawings, in which.

DETAILED DESCRIPTION OF A PREFERRED EMBODIMENT

A preferred embodiment of the present in will now be described with reference to the accompanying drawings. The preferred embodiment relates to a method of processing a wafer W as an exemplary embodiment of a substrate. The method of the preferred embodiment may also be applied to substrates other than wafers. The substrate to be processed by this method is not limited to wafers.

Figure 1:
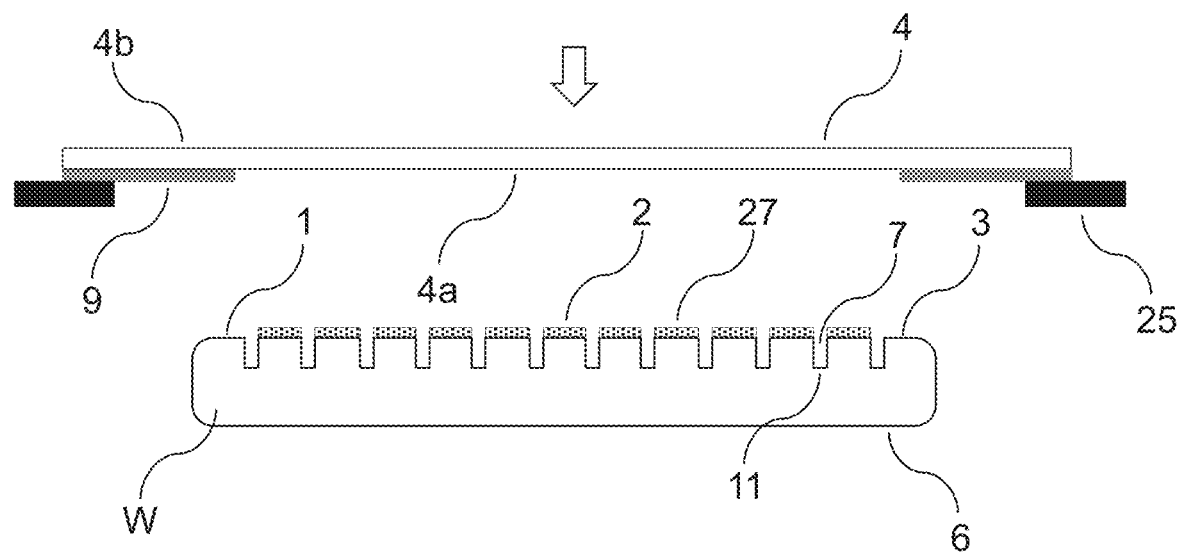
FIG. 1 is a cross-sectional view illustrating a step of applying a protective film to a substrate in a method of processing the substrate according to an embodiment of the present invention.

The wafer W can be, for example, a MEMS wafer having MEMS devices formed on the surface of a front side 1 thereof (see FIG. 1). However, the wafer W is not limited to a MEMS wafer, but may also be a CMOS wafer having CMOS devices, preferably as solid-state imaging devices, formed on the front side 1 thereof or a wafer with other types of devices on the front side 1. The method of the preferred embodiment may also be applied to substrates which do not have devices formed thereon.

The wafer W may be made of a semiconductor, e.g., silicon (Si). Such a silicon wafer W can include devices, such as ICs (integrated circuits) and LSIs (large scale integrations), on a silicon substrate. Alternatively, the wafer W may be an optical device wafer configured by forming optical devices, such as LEDs (light emitting diodes), on an inorganic material substrate of, for example, ceramic, glass or sapphire. The wafer W is not limited to this and can be formed in any other way. Furthermore, also a combination of the above described exemplary wafer designs is possible.

The wafer W can have a thickness before grinding in the μm range, preferably in the range of 625 to 925 μm.

The wafer W preferably exhibits a circular shape. However, the shape of the wafer W is not particularly limited. In other embodiments, the wafer W may have, for example, an oval shape, an elliptical shape or a polygonal shape, such as a rectangular shape or a square shape.

The wafer W is provided with a plurality of crossing division lines 11 (see FIG. 1), also termed streets, formed on the front side 1 thereof, thereby partitioning the wafer W into a plurality of rectangular regions where devices 27, such as those described previously, are respectively formed. These devices 27 are formed in a device area 2 of the wafer W. In the case of a circular wafer W, this device area 2 is preferably circular and arranged concentrically with the outer circumference of the wafer W. The method of the preferred embodiment may also be applied to substrates which do not have devices formed thereon. For example, instead of the devices 27, a sensitive surface layer which requires protection may be present on the front side 1 of the substrate between the division lines 11.

The device area 2 is surrounded by an annular peripheral marginal area 3, as is schematically shown in FIG. 1. In this peripheral marginal area 3, no devices are formed. The peripheral marginal area 3 is preferably arranged concentrically to the device area 2 and/or the outer circumference of the wafer W. The radial extension of the peripheral marginal area 3 can be in the mm range and preferably ranges from 1 to 3 mm.

The wafer W further has a back side 6 opposite to the front side 1 (see FIG. 1).

On the front side 1 of the wafer W, a plurality of recesses 7 are formed. Each of the recesses 7 extends along a respective one of the division lines 11. The recesses 7 may be trenches, grooves or cuts, i.e., partial cuts extending along part of the thickness of the wafer W. For example, the recesses 7 may be formed by removing wafer material along the division lines 11, e.g., by mechanical cutting, such as blade dicing or sawing, and/or by laser cutting and/or by plasma cutting and/or by etching, e.g., wet etching or dry etching, and/or lithography, such as optical lithography or electron beam lithography. The recesses 7 extend inwards from a plane surface of the wafer W.

In the following, the method of processing the wafer W according to the embodiment of the present invention will be described with reference to FIGS. 1 to 8.

A protective film 4 is provided, as is shown in FIG. 1. For example, the protective film 4 may have a thickness in the range of 5 to 200 μm. The protective film 4 is made of a polyolefin. For example, the protective film 4 may be made of polyethylene (PE) or polypropylene (PP). The protective film 4 has a front surface 4a and a back surface 4b opposite thereto (see FIG. 1).

An adhesive layer 9 is applied to a part of the front surface 4a of the protective film 4. Specifically, the adhesive layer 9 has an annular shape and is provided only in a circumferential or peripheral area of the front surface 4a of the protective film 4. The circumferential or peripheral area surrounds a central area of the front surface 4a of the protective film 4. In other embodiments, the adhesive layer 9 may be omitted. In this case, the front, surface 4a of the protective film 4 may be in direct contact with the front side 1 of the wafer W in the entire region where the front surface 4a of the protective film 4 is in contact with the front side 1.

FIG. 1 illustrates a step of applying the protective film 4 to the front side 1 of the wafer W.

As is shown in FIG. 1, the annular adhesive layer 9 has an outer diameter which is larger than the inner diameter of an annular frame 25. Further, the annular adhesive layer 9 has an inner diameter which is smaller than the outer diameter of the wafer W but larger than the outer diameter of the device area 2. Hence, it can be reliably ensured that the adhesive of the adhesive layer 9 comes into contact, only with the peripheral marginal area 3 on the front side 1 of the wafer W in which no devices are formed.

Before applying the protective film 4 to the wafer W, a peripheral portion of the protective film 4 is mounted on the annular frame 25 by means of the adhesive layer 9. The annular frame 25 may be a semiconductor-sized annular frame. Subsequently, as is indicated by an arrow in FIG. 1, the protective film 4 is applied to the front side 1 of the wafer W and the protective film 4 is adhered to the peripheral portion of the front side 1 by the adhesive layer 9.

The adhesive forming the adhesive layer 9 may be curable by an external stimulus, such as heat, UV radiation, an electric field and/or a chemical agent. In this way, the protective film 4 can be particularly easily removed from the wafer W after processing.

In particular, the adhesive may be an acrylic resin or an epoxy resin. A preferred example of a UV curable-type resin for the adhesive is, e.g., urethane acrylate oligomer.

Further, the adhesive may be, for example, a water soluble resin.

Figure 2:
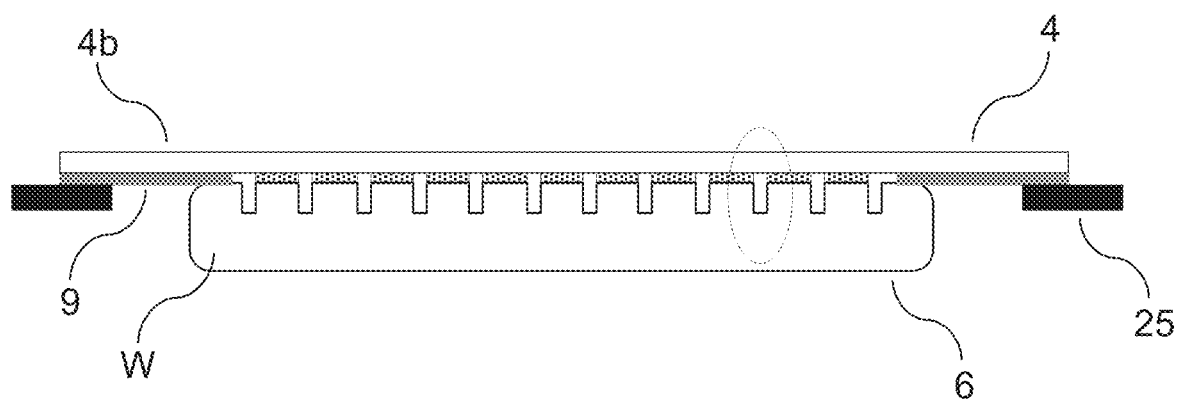
FIG. 2 is a cross-sectional view showing the outcome of the step illustrated in FIG. 1.

The protective film 4 is applied to the front side 1 of the wafer W so that the central area of the front surface 4a of the protective film 4, i.e., the area of the front surface 4a inside the annular adhesive layer 9, is in direct contact with the front side 1 of the wafer W (see FIG. 2). Thus, no material, in particular, no adhesive, is present between the central area of the front surface 4a of the protective film 4 and the front side 1 of the wafer W.

Figure 3:
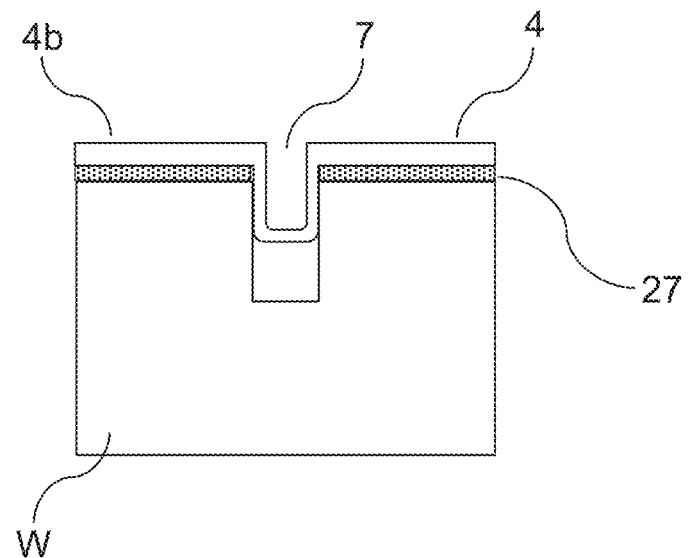
FIG. 3 is an enlarged cross-sectional view of the encircled area in FIG. 2 in the method of processing the substrate according to the embodiment of the present invention.
Figure 4:
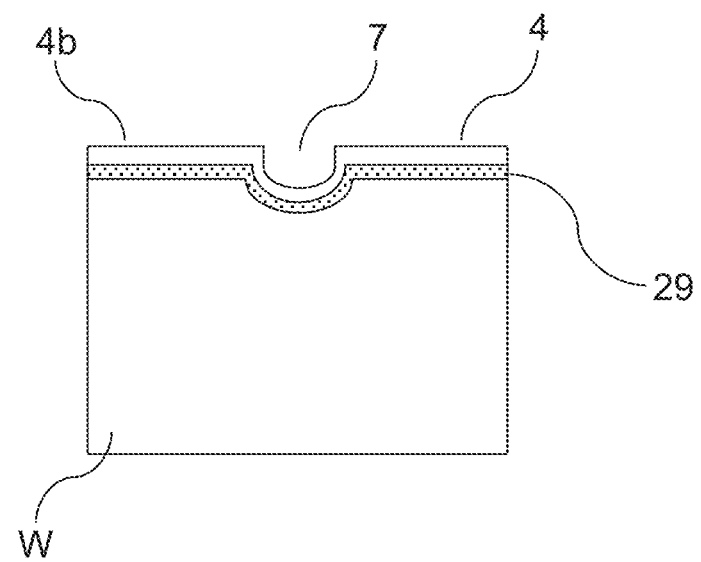
FIG. 4 is an enlarged cross-sectional view of the encircled area in FIG. 2 in a modification of the method of processing the substrate according to the embodiment of the present invention.

Subsequently, pressure is applied to the protective film 4 so that the protective film 4 enters into the recesses 7 along at least part of a depth of the recesses 7, as will be further detailed below with reference to FIGS. 3 and 4. By applying the pressure, the protective film 4 is attached to the front side 1 of the wafer W also in the central area of the front surface 4a of the protective film 4. An attachment force between protective film 4 and wafer W is generated through the application of pressure.

In the present embodiment, the application of pressure to the protective film 4 consists of applying a vacuum to the protective film 4 during and/or after applying the protective film 4 to the front side 1 of the substrate. The vacuum is applied to the protective film 4 so that the protective film 4 enters into the recesses 7 along at least part of the depth of the recesses 7. In this way, it is particularly reliably ensured that the protective film 4 enters into the recesses 7 along at least part of the depth of the recesses 7. The vacuum may be applied to the protective film 4 in a vacuum mounter, such as a vacuum chamber (not shown).

Optionally, the protective film 4 may be heated during and/or after applying the protective film 4 to the front side 1 of the wafer W. In this case, the vacuum may be applied to the protective film 4 during and/or before and/or after heating the protective film 4.

An attachment force between protective film 4 and wafer W may be generated through the heating process. The attachment of the protective film 4 to the wafer W may be caused in the heating process itself and/or in a subsequent process of allowing the protective film 4 to cool down.

The protective film 4 may be softened by the heating process. Upon cooling down, e.g., to its initial temperature, the protective film 4 may reharden, e.g., so as to create a form fit and/or a material bond to the wafer W. By softening the protective film 4 through the heating process, it can be particularly reliably ensured that the protective film 4 enters into the recesses 7 along at least part of the depth of the recesses 7.

The outcome of the process of attaching the protective film 4 to the front side 1 of the wafer W is shown in FIG. 2. FIGS. 3 and 4 are enlarged cross-sectional views of the encircled area in FIG. 2 in the method of processing the wafer W according to the embodiment of the present invention and in a modification thereof, respectively.

In the method of the present embodiment, the recesses 7 have a depth, i.e., an extension along the thickness direction of the wafer W, of about 50% of the wafer thickness. The protective film 4 enters into the recesses 7 to a depth of approximately 50% of the depth of the recesses 7, as is illustrated in FIG. 3.

In the modification of the method of the present embodiment, no devices are present on the front side 1 of the wafer W. Instead, a continuous sensitive surface layer 29 is formed on the front side 1 (see FIG. 4). Further, the depth of the recesses 7 is significantly smaller than that of the embodiment shown in FIG. 3, namely approximately 10% of the wafer thickness. The protective film 4 enters into the recesses 7 along the entire depth of the recesses 7, as is shown in FIG. 4.

Figure 5:
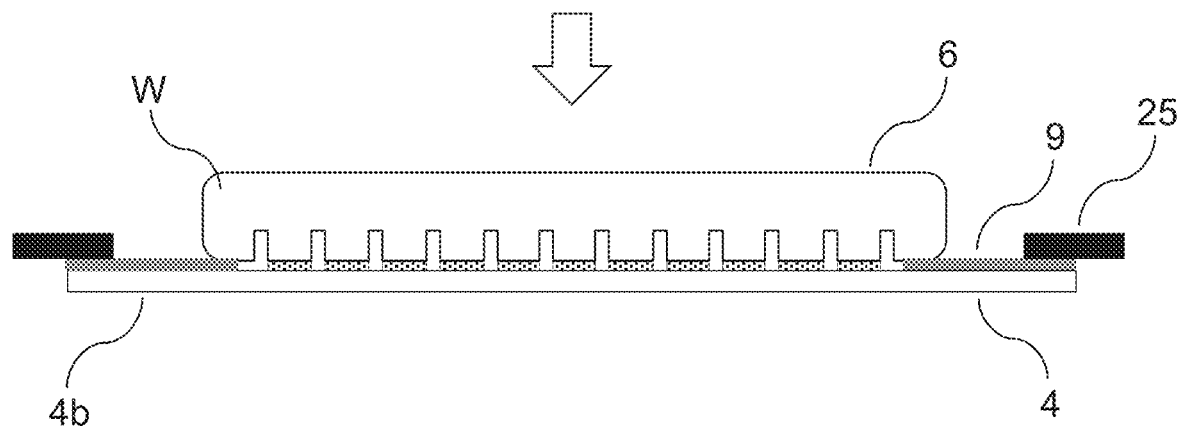
FIG. 5 is a cross-sectional view illustrating a step of grinding the substrate in the method of processing the substrate according to the embodiment of the present invention.
Figure 6:
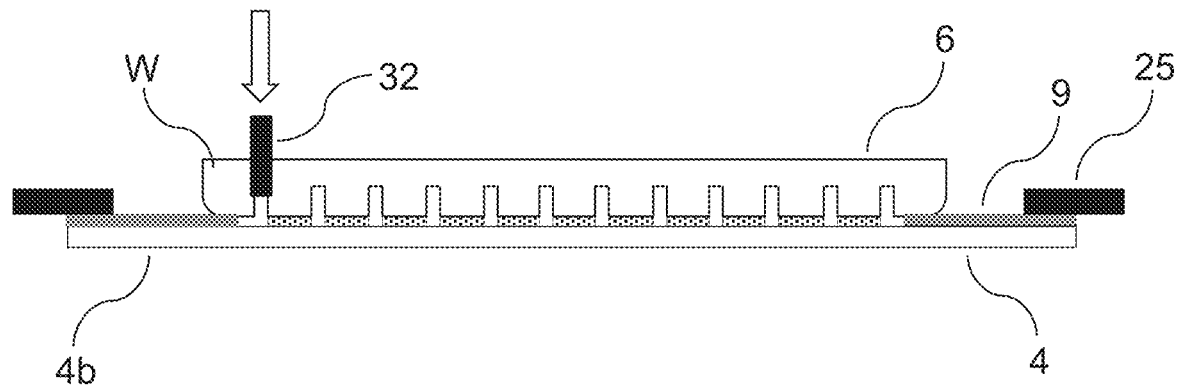
FIG. 6 is a cross-sectional view illustrating a step of dividing the substrate into a plurality of separate elements in the method of processing the substrate according to the embodiment of the present invention.

After attaching the protective film 4 to the front side 1 of the wafer W, the back side 6 of the wafer W is ground to adjust the wafer thickness, as is indicated by an arrow in FIG. 5. During the grinding process, the front side 1 is reliably protected from damage and contamination by the protective film 4. In particular, since the protective film 4 has entered into the recesses 7 along part of the depth of the recesses 7, the protective film 4 can particularly securely hold the wafer W in its position, so that no movement or shift, such as a die shaft, occurs. Hence, the accuracy of subsequent processing and handling steps, such as cutting, dicing or picking up steps, can be significantly enhanced.

Optionally, the method of the present embodiment may further comprise polishing, e.g., dry polishing or chemical mechanical polishing (CMP), and/or etching, e.g., wet etching or dry etching, such as plasma etching, the back side 6 of the wafer W. The steps of polishing and/or etching may be performed after grinding. The steps of polishing and/or etching may be performed before dividing the wafer W.

Figure 7:
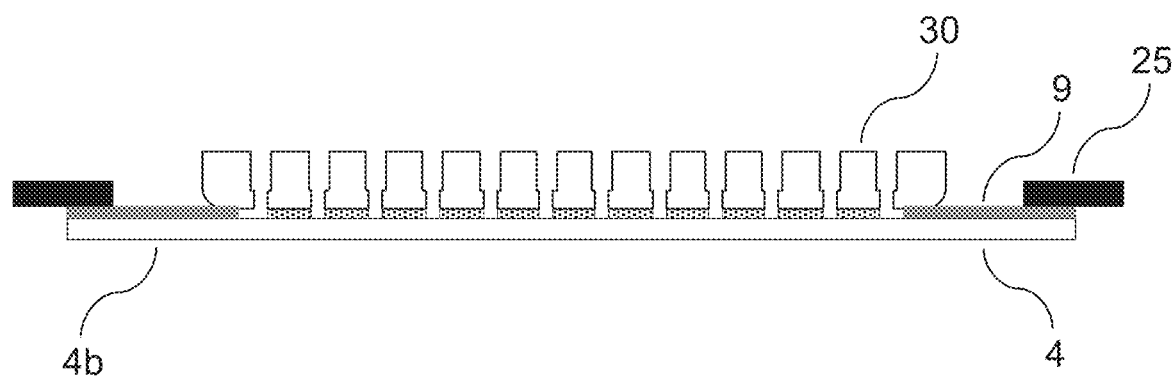
FIG. 7 is a cross-sectional view showing the outcome of the step illustrated in FIG. 6.

The grinding step illustrated in FIG. 5 is followed by a step of dividing the wafer W into separate, individual dies 30 (see FIG. 7). Specifically, as is indicated by an arrow in FIG. 6, the wafer W is cut from its back side 6 along the division lines 11 by using a dicing blade 32 so as to fully divide the wafer W. The outcome of this dividing step is shown in FIG. 7. Alternatively, the wafer W may be cut, for example, by a laser cutting process, by a plasma cutting process or by a dicing before grinding process, as has been detailed above.

In the process of dividing the wafer W, the partial extension of the protective film 4 into the recesses 7 provides reliable protection also to the side walls of the dies 30 to be obtained. Further, after the wafer W has been divided, the dies 30 are securely held in their positions by the protective film 4, thus greatly facilitating a subsequent step of picking up the dies 30. In particular, this pick up step can be performed in a simple manner and with an especially high degree of precision.

In other embodiments, the wafer W or another type of substrate may be divided in different ways, as has been detailed above. For example, a step of cutting the wafer W or the other type of substrate may be performed before grinding the wafer W or the substrate. Also, in some embodiments, no grinding of the wafer W or the other type of substrate is carried out.

Figure 8:
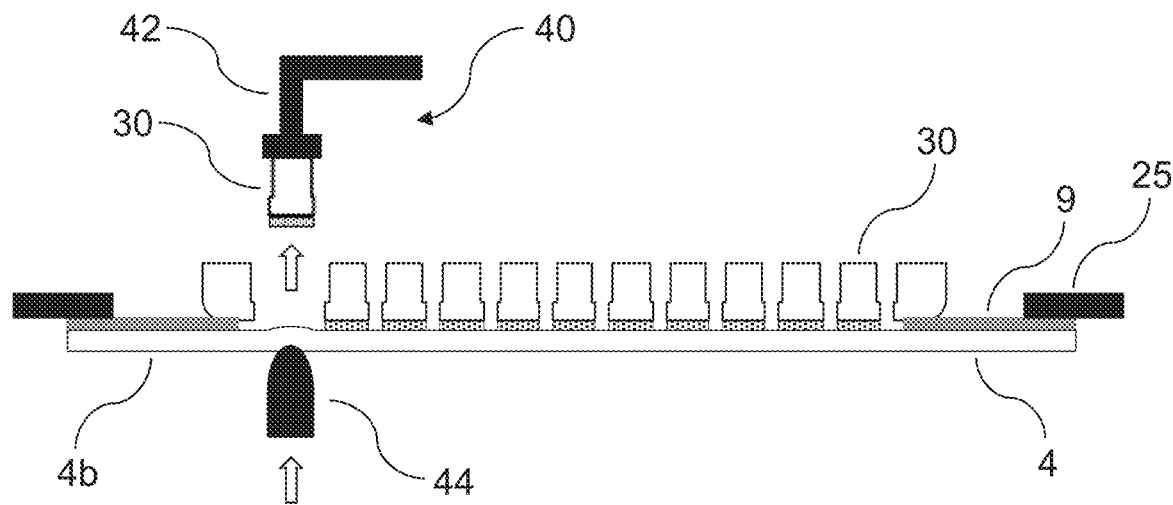
FIG. 8 is a cross-sectional view illustrating a step of picking up the separate elements from the protective film in the method of processing the substrate according to the embodiment of the present invention.
Figure 9:
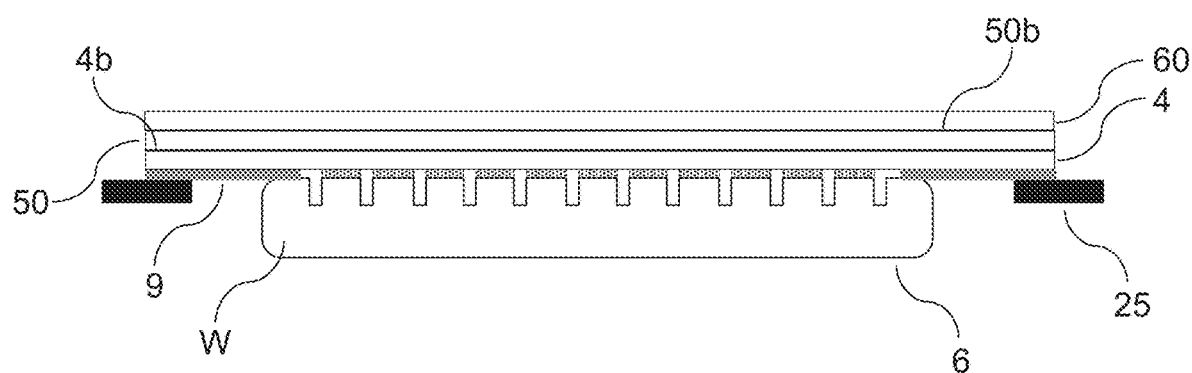
FIG. 9 is a cross-sectional view showing the outcome of a step of applying a protective film, having a cushioning layer and a base sheet attached thereto, to a substrate in a method of processing the substrate according to another embodiment of the present invention.

After dividing the wafer W into the separate dies 30, the dies 30 are individually picked up by using a pick up device 40, as is shown in FIG. 8. The pick up device 40 comprises a pick up collet 42 and a push up pin 44. In the pick up process, the die 30 to be picked up is first pushed up from the side of the back surface 4b of the protective film 4 by the push up pin 44, as is indicated by an arrow in FIG. 8. In this way, the die 30 is lifted upward and, thus, can be easily accessed by the pick up collet 42. Subsequently, the pick up collet 42 picks up the die 30, e.g., by vacuum suction, and removes it from the remainder of the divided wafer W, as is indicated by another arrow in FIG. 8.

As has been detailed above, the protective film 4 is attached to the wafer W so that the adhesive of the adhesive layer 9 comes into contact only with the peripheral marginal area 3 on the front side 1 of the wafer W in which no devices are formed. No adhesive is present in the device area 2. Thus, the step of picking up the dies 30 is greatly facilitated. For one thing, the force required for picking up the dies 30 from the protective film 4 is significantly lowered. Hence, the pick up step can be carried out in a simple manner and the risk of any mechanical damage to the dies 30 is reduced or even eliminated. For another thing, a contamination of the dies 30 due to adhesive residues is reliably prevented.

In the method of the present embodiment, the protective film 4 remains attached to the wafer W throughout the wafer processing. The same protective film 4 is used for the steps of grinding the wafer back side 6 (FIG. 5), dividing the wafer W into the dies 30 (FIG. 6) and picking up the dies 30 (FIG. 8). Therefore, no steps of peeling the protective film 4 from the wafer W and remounting the wafer W to a different film or tape are required. Hence, the processing method is significantly simplified. Moreover, due to the reduced number of required wafer handling and processing steps, any risk of damage to the wafer W can be further reduced. Also, this approach is particularly efficient, for example, in terms of processing time and costs.

In the method of the present embodiment, a single layer arrangement, comprising only the protective film 4, is used. In other embodiments, configurations are employed in which a cushioning layer (not shown) is attached to the back surface 4b of the protective film 4. Optionally, a base sheet (not shown) may be attached to a back surface of the cushioning layer. The cushioning layer and/or the base sheet may have the properties, characteristics and features detailed above.

The invention claimed is:

1. A method of processing a substrate, wherein
the substrate has one side and a side being opposite to the one side,
the substrate has, on the one side or on the side being opposite to the one side, at least one recess, and
the method comprises:
providing a protective film having a central area and a peripheral area in a front surface of the protective film, the peripheral area surrounding the central area,
at least the central area of the protective film not having an added adhesive such that peeling the protective film could leave an adhesive residue on the substrate;
applying the protective film to the side of the substrate having the at least one recess so that at least the central area of the front surface of the protective film is in direct contact with the side of the substrate having the at least one recess such that no adhesive is present between at least the central area of the front surface of the protective film and the side of the substrate having the at least one recess;
applying pressure to the protective film so that the protective film enters into the at least one recess along at least part of a depth of the recess; and
processing the one side of the substrate and/or the side of the substrate being opposite to the one side.

2. The method according to claim 1, wherein applying the pressure to the protective film comprises applying a vacuum to the protective film during and/or after applying the protective film to the side of the substrate having the at least one recess.

3. The method according to claim 1, wherein the substrate is a wafer having on the one side a device area with a plurality of devices.

4. The method according to claim 1, wherein at least one division line is formed on the one side of the substrate and the at least one recess extends along the at least one division line.

5. The method according to claim 1, further comprising heating the protective film during and/or after applying the protective film to the side of the substrate having the at least one recess.

6. The method according to claim 1, wherein the pressure is applied to the protective film so that the protective film enters into the at least one recess to a depth of 3 to 500 µm, preferably 5 to 300 µm, in particular, 5 to 50 µm.

7. The method according to claim 1, wherein the at least one recess was formed by removing substrate material on the one side of the substrate or on the side of the substrate being opposite to the one side.

8. The method according to claim 1, wherein
the processing includes grinding the side of the substrate being opposite to the one side to adjust the substrate thickness.

9. The method according to claim 1, wherein
the protective film is provided with an adhesive layer, only in the peripheral area of the front surface of the protective film, and
the protective film is applied to the side of the substrate having the at least one recess so that the adhesive layer comes into contact only with a peripheral portion of the side of the substrate having the at least one recess.

10. The method according claim 1, wherein a cushioning layer is attached to a back surface of the protective film opposite to the front surface thereof, before processing the one side of the substrate and/or the side of the substrate being opposite to the one side.

11. The method according to claim 10, wherein a base sheet is attached to a back surface of the cushioning layer, before processing the one side of the substrate and/or the side of the substrate being opposite to the one side.

12. The method according to claim 1, further comprising dividing the substrate into a plurality of separate elements, and
picking up the separate elements from the protective film after processing the one side of the substrate and/or the side of the substrate being opposite to the one side.

13. The method according to claim 1, wherein the protective film is made of a polymer, in particular, a polyolefin.

14. The method according to claim 1, further comprising attaching a peripheral portion of the protective film to an annular frame, before applying the protective film to the side of the substrate having the at least one recess.

15. The method according to claim 1, wherein the protective film remains attached to the substrate throughout the processing of the one side of the substrate and/or the side of the substrate being opposite to the one side.

16. A method of processing a substrate, wherein
the substrate has one side and a side being opposite to the one side,
the substrate has, on the one side or on the side being opposite to the one side, at least one recess, and
the method comprises:
providing a protective film;
applying the protective film to the side of the substrate having the at least one recess so that at least a central area of a front surface of the protective film is in direct contact with the side of the substrate having the at least one recess;

applying pressure to the protective film so that the protective film enters into the at least one recess along at least part of a depth of the recess;

processing the one side of the substrate and/or the side of the substrate being opposite to the one side, dividing the substrate into a plurality of separate elements, and picking up the separate elements from the protective film.

17. The method according to claim 16, wherein applying the pressure to the protective film comprises applying a vacuum to the protective film during and/or after applying the protective film to the side of the substrate having the at least one recess.

18. The method according to claim 16, wherein the substrate is a wafer having on the one side a device area with a plurality of devices.

19. The method according to claim 16, wherein at least one division line is formed on the one side of the substrate and the at least one recess extends along the at least one division line.

20. The method according to claim 16, further comprising heating the protective film during and/or after applying the protective film to the side of the substrate having the at least one recess.

21. The method according to claim 16, wherein the pressure is applied to the protective film so that the protective film enters into the at least one recess to a depth of 3 to 500 µm, preferably 5 to 300 µm, in particular, 5 to 50 µm.

22. The method according to claim 16, wherein the at least one recess was formed by removing substrate material on the one side of the substrate or on the side of the substrate being opposite to the one side.

23. The method according to claim 16, wherein
the processing includes grinding the side of the substrate being opposite to the one side to adjust the substrate thickness.

24. The method according to claim 16, wherein
the protective film is provided with an adhesive layer,
the adhesive layer is provided only in a peripheral area of the front surface of the protective film, the peripheral area surrounding the central area of the front surface of the protective film, and
the protective film is applied to the side of the substrate having the at least one recess so that the adhesive layer comes into contact only with a peripheral portion of the side of the substrate having the at least one recess.

25. The method according claim 16, wherein a cushioning layer is attached to a back surface of the protective film opposite to the front surface thereof, before processing the one side of the substrate and/or the side of the substrate being opposite to the one side.

26. The method according to claim 25, wherein a base sheet is attached to a back surface of the cushioning layer, before processing the one side of the substrate and/or the side of the substrate being opposite to the one side.

* * * * *